United States Patent [19]
Wang et al.

[11] Patent Number: 5,419,038
[45] Date of Patent: May 30, 1995

[54] METHOD FOR FABRICATING THIN-FILM INTERCONNECTOR

[75] Inventors: Wen-chou V. Wang, Cupertino; Solomon I. Beilin, San Carlos; William T. Chou, Cupertino; David Kudzuma, San Jose; Michael G. Lee, San Jose; Michael G. Peters, Santa Clara; James J. Roman, Milpitas; Som S. Swamy, Danville, all of Calif.

[73] Assignee: Fujitsu Limited, Kawasaki, Japan

[21] Appl. No.: 78,461

[22] Filed: Jun. 17, 1993

[51] Int. Cl.$^6$ .............................................. H05K 3/36
[52] U.S. Cl. ........................................ 29/830; 29/829; 29/852; 174/254; 174/255; 427/97
[58] Field of Search .................. 174/254, 255; 29/852, 29/829, 830, 830; 427/97

[56] References Cited

U.S. PATENT DOCUMENTS

| | | | |
|---|---|---|---|
| 3,471,348 | 10/1969 | Shaheen et al. | 174/255 X |
| 4,371,744 | 2/1983 | Badet et al. | |
| 4,687,695 | 8/1987 | Hamby | 174/254 X |
| 4,716,259 | 12/1987 | Tokura et al. | |
| 4,721,831 | 1/1988 | Vora | |
| 4,781,969 | 11/1988 | Kobayashi et al. | 428/209 |
| 4,800,461 | 1/1989 | Dixon et al. | 361/398 |
| 4,855,871 | 8/1989 | Young | 361/411 |
| 4,899,439 | 2/1990 | Potter et al. | 29/846 |
| 4,910,643 | 3/1990 | Williams | 361/414 |
| 4,931,134 | 6/1990 | Hatkevitz et al. | 174/254 X |
| 4,956,749 | 9/1990 | Chang | 361/414 |
| 4,963,697 | 10/1990 | Peterson et al. | 174/252 |
| 4,965,702 | 10/1990 | Lott et al. | 361/401 |
| 5,004,639 | 4/1991 | Desai | 174/254 X |
| 5,034,569 | 7/1991 | Gofuku et al. | 174/254 |
| 5,089,880 | 2/1992 | Meyer et al. | 357/75 |
| 5,121,297 | 6/1992 | Haas | 174/255 X |
| 5,142,448 | 8/1992 | Kober et al. | 174/254 X |
| 5,144,742 | 9/1992 | Lucas et al. | 174/254 X |

FOREIGN PATENT DOCUMENTS

| | | | |
|---|---|---|---|
| 2-121390 | 5/1990 | Japan | 29/829 |
| 3-62591 | 3/1991 | Japan | 29/829 |
| 3-214792 | 9/1991 | Japan | 29/829 |
| 93/11652 | 6/1993 | WIPO | 29/852 |

Primary Examiner—Carl J. Arbes
Attorney, Agent, or Firm—Christie, Parker & Hale

[57] ABSTRACT

A three dimensional thin-film interconnector is fabricated by depositing a dielectric layer onto the surface of a substrate, depositing a layer of conductive material onto the dielectric layer to form a signal plane, depositing a dielectric layer onto the surface of the signal plane, forming a plurality of through holes in the dielectric layer that extend to the signal plane, and filling the through holes with an electrically conductive material to form vias. The sequence of forming a signal plane, depositing a dielectric layer, forming a plurality of through holes, and filling the through holes is repeated until a predetermined number of signal planes and a predetermined arrangement of vias are obtained. The through holes are formed at locations in the dielectric layers corresponding to both predetermined electrical connections and the vias in a preceding dielectric layer. The signal planes are formed at different locations on the substrate. The sequence of signal planes and dielectric layers at the same location on the substrate form a signal plane set which defines a connector. Contact pads are deposited onto the surface of a final dielectric layer and electrically connect with each via. Wires are used to electrically connect the contact pads of one connector to corresponding contact pads of another connector. A portion of the substrate and dielectric layers not comprising a signal plane set is removed, forming electrical connectors flexibly attached by the plurality of wires.

33 Claims, 5 Drawing Sheets

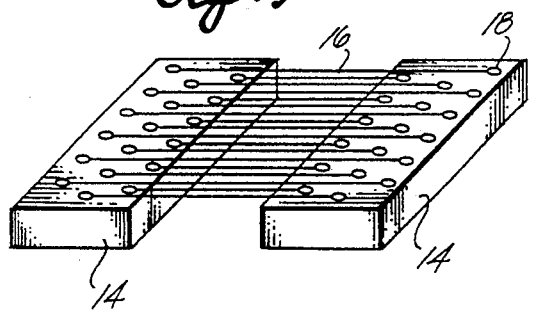
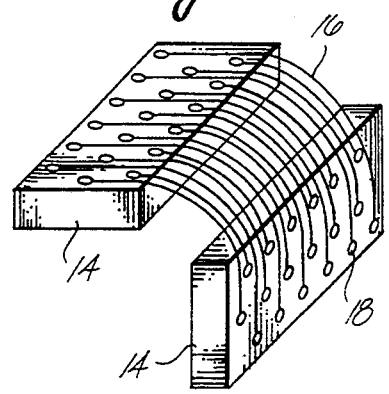
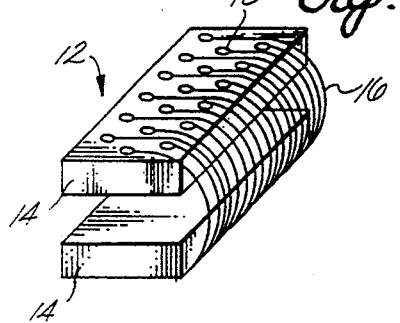
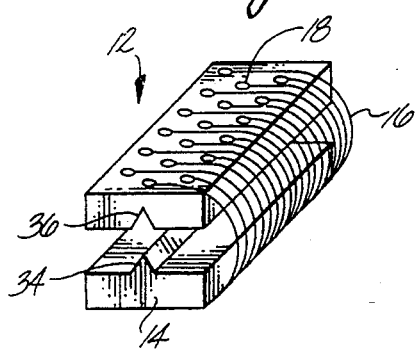
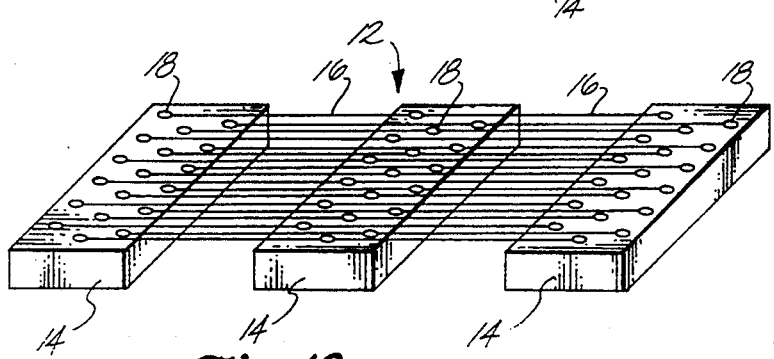
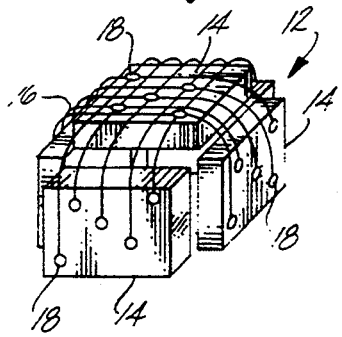

METHOD FOR FABRICATING THIN-FILM INTERCONNECTOR

FIELD OF THE INVENTION

The present invention relates generally to the interconnection of electronic signals between multiple electronic components. In particular, the present invention provides a means for interconnecting two or more electrical components having different planes of orientation.

BACKGROUND OF THE INVENTION

In computer applications many different electrical components are often electrically connected to a circuit board or to each other by using electrical interconnectors. Electrical interconnectors typically comprise a body made from a rigid or semi-flexible dielectric material. The body houses a plurality of electrically conductive wires which are each capable of transmitting electrical power or an electrical signal through the body. Such interconnectors are well known in the art and are configured having a plurality of electrical contacts at one surface, arranged to connect with corresponding electrical contacts of a first electrical component, and an identical plurality of electrical contacts at another surface, arranged to connect with corresponding electrical contacts of a second electrical component. Electrical power or electrical signals are transferred to and/or from each electrical component by connection with the electrical contacts that are connected to the conductive wires within the body of the interconnector.

Computers typically comprise a number of different electrical components such as multi-chip modules and the like which each require some type of electrical interconnection with other electrical components in the computer. As the need for increased data handling capacity and data handling speed for the computer increases, the amount of electrical components within the computer also increases. In order to accommodate the large number of electrical components within the computer each component is either reduced in size or combined with other components to form a single integrated package. Reducing the size of or integrating each electrical component effectively reduces the amount of space occupied by the electrical component, thereby facilitating the use of more electrical components within the same amount of space than previously obtained.

However, regardless of the size or combination of electrical components, each electrical component will still comprise approximately the same number of electrical connectors requiring interconnection within the computer. Therefore, as the size of each electrical component is reduced the amount of electrical components contained within a computer increases as well as the amount of electrical connectors requiring interconnection. In order to further optimize space the now reduced in size electrical components are placed in close proximity to each other. Therefore, the number of electrical connections per unit of space within the computer is high.

In order to accommodate the high density of electrical connections corresponding to each electrical component the electrical interconnector should be of the high density type, i.e., it should be configured having a complementary arrangement of accommodating connections. Fabricating electrical interconnectors using printed circuit board technology is known in the art. However, using printed circuit technology effectively limits the number of connections that can be manufactured within each interconnector. The high density of connections for electrical components used in high performance computer applications requires the use of interconnectors having a higher density than can be provided using printed circuit board technology.

In the construction of high performance computer, many electrical components, such as multi-chip modules and the like, must be interconnected in a manner that will optimize the use of space. The need to optimize space oftentimes results in placing electrical components requiring interconnection at different heights or planes of orientation to each other. Therefore, in order to accommodate electrical interaction between electrical components oriented in such a manner, an electrical interconnector must be manufactured having a configuration that accounts for the difference in orientation.

High performance computers are constructed from many different electrical components requiring a means of electrical interconnection that is capable of accommodating the variety of different orientations that each electrical component may be placed. Ideally, the most practical and efficient method of interconnecting the electrical components would be to limit their placement, with respect to interconnecting components, to a single preferred orientation. Unfortunately, however, computer technology moves ahead at a rapid pace requiring that the computer designer be somewhat flexible in the arrangement of the electrical components making up the computer to permit the incorporation of more and more components or different components as the need for faster or high-capacity computers continues. Therefore, the design and manufacture of a new electrical interconnector to accommodate each possible variation in orientation between two interconnecting electrical components is not realistic.

The construction of high performance computers often requires the electrical interconnection of more than one electrical component, each having a different height or plane of orientation than that of its interconnecting component. The interconnection of more than one electrical component adds to the possible variety of orientations that may exist, and thus further complicates the method for interconnecting each component. An electrical interconnector that can accommodate electrical interconnection between multiple electrical components having multiple planes of orientation must also be capable of accommodating a large number of electrical connections for each electrical component (i.e., it must be a high-density electrical interconnector).

The need to accommodate a large number of electrical connections per electrical component is a result of the need to optimize space in the construction of a high performance computer. As computer and electrical technology has evolved, the size of electrical components used in the construction of the computer has decreased. The decrease in the size of electrical components is partly due to consolidation. For example, the combination of many integrated circuits to form a single multi-chip module. The multi-chip module (MCM), although relatively small in size, comprises many different circuits which all require electrical connection. Accordingly, the electrical interconnector used to connect such MCMs must be high-density so that it can accommodate such a large number of electrical connections in a small amount of space.

It is, therefore, desirable that an electrical interconnector be constructed to accommodate a large number electrical connections, i.e., be a high density interconnector capable of accommodating electrical interconnection in high performance computers. It is desirable that an electrical interconnector be constructed to accommodate interconnection between two or more electrical components each positioned in a variety of different heights and positions and having a different plane of orientation. It is desirable that such an electrical interconnector accommodate a high number of electrical connections per surface area. It is also desirable that the method for manufacturing the electrical interconnector, as well as the materials used, be both practical and economically feasible.

SUMMARY OF THE INVENTION

There is, therefore, provided in practice of this invention according to a presently preferred embodiment, a method for fabricating a three dimensional thin-film interconnector that permits electrical connection between two or more electrical components that are positioned at different planes of orientation and have a high density of electrical connections. The thin-film interconnector is manufactured by depositing a dielectric layer onto the surface of a substrate. A electrically conductive signal plane is deposited onto the surface of the dielectric layer at selected locations that are electrically isolated from each other. A second dielectric layer similar to the preceding dielectric layer is deposited onto the surface of both the signal plane and the portions of the preceding dielectric layer residing between the deposited portions of the signal plane.

A plurality of through holes are formed in the second dielectric layer that extend from the surface of the dielectric layer to the preceding signal plane. The number and arrangement of the through holes are determined according to the electrical connection requirements of the particular electrical components. The through holes are filled with electrically conductive material to form vias. The sequence of depositing a dielectric layer, selectively depositing signal planes, forming a plurality of through holes, and filling the plurality of through holes may be repeated until a predetermined arrangement of signal planes and vias are obtained.

Each signal plane is deposited onto a selected portion of the preceding dielectric layer. The interdigitated sequence of signal planes and dielectric layers in each selected portion make up a signal plane set. The thin-film interconnector comprises at least two connectors that each comprise a signal plane set. If desired, a ground plane may be substituted for a signal plane during the above mentioned sequence. The ground plane comprises an electrically conductive material that serves to minimize any unwanted electromagnetic effects that may otherwise be caused by signal planes in close proximity to one another. However, unlike a signal plane, the ground plane does not require electrical connection with a via.

After the predetermined arrangement of signal planes and vias are obtained, a plurality of contact pads are deposited onto the surface of a final dielectric layer forming the front side surface. The contact pads are deposited at locations corresponding to a plurality of vias in the uppermost signal plane set. Each contact pad is electrically connected to a via which is electrically connected with a signal plane. A plurality of wires are selectively deposited onto the surface of the final dielectric layer. The wires are deposited so that each wire forms an electrical connection between contact pads that are electrically connected to a signal plane set of one connector and the corresponding contact pads that are electrically connected to a signal plane set of another connector.

The wires extend between the contact pads of each connector across an intermediate body comprising the substrate and the dielectric layers. The intermediate body is removed so that the connectors are mechanically and electrically connected to each other by the plurality of wires. The flexible wire connection between corresponding connectors allows the thin-film interconnector to accommodate electrical connection with electrical components positioned in different planes of orientation. The signal planes, ground planes, vias, contact pads, and wires all comprise electrically conductive materials having approximately equal coefficients of thermal expansion. Matching the coefficient of thermal expansion in these components is desired in order to minimize the occurrence of thermal stress related mechanical failures.

The method of fabricating the thin-film interconnector according to practice of this invention may be used to construct interconnectors having more than two connectors if desired. Additionally, a back side surface of the substrate, opposite to the front side surface, may be fabricated having approximately complementary integral surface features. These interacting surface features may be used to accommodate alignment between the back side surfaces of each connector, and may ultimately be used in conjunction with an adhesive to secure both connectors together should a nonflexible thin-film interconnection be desired.

BRIEF DESCRIPTION OF THE DRAWINGS

These and other features and advantages of the present invention will become appreciated as the same becomes better understood with reference to the specification, claims and drawings wherein:

FIG. 9 is a perspective view of a preferred embodiment of the thin-film electrical interconnector;

FIG. 10 is a perspective view of a preferred embodiment of the thin-film electrical interconnector oriented with its connectors perpendicular to each other;

FIG. 11 is a perspective view of a preferred embodiment of the thin-film electrical interconnector oriented with its connectors stacked one on top of the other;

FIG. 12 is a perspective view of a preferred embodiment of the thin-film electrical interconnector having an alignment feature at the back side of each connector;

FIG. 13 is a perspective view of an alternative embodiment of the thin-film electrical interconnector comprising three connectors; and FIG. 14 is a perspective view of an alternative embodiment of the thin-film electrical interconnector comprising five connectors.

DETAILED DESCRIPTION

Figure 1:
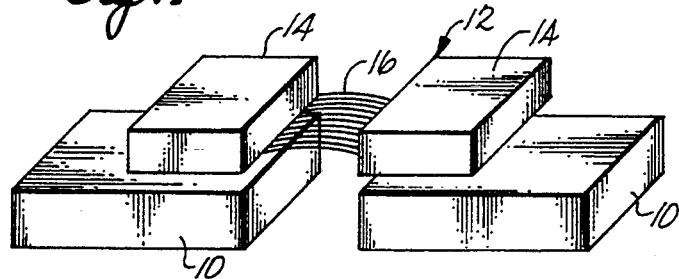
FIG. 1 is a perspective view of a thin-film electrical interconnector manufactured according to principles of the invention as used to electrically connect two multi-chip modules.

An electrical interconnector comprises, in the most general sense, a plurality of electrically conductive wires configured in such a manner as to facilitate their connection between at least two electrical components. In order to accommodate interaction with electrical components, the end portions of each wire should be permanently fixed in a dielectric material. Fixing the end portions of each wire in a dielectric material allows each wire to be permanently arranged in a manner that will correspond to a particular electrical component that it will connect with. Thin-film technology permits the fabrication of interconnectors comprising a plurality of wires fixed in a dielectric body that are very small in size and capable of accommodating a large number of connections.

Additionally, the use of thin-film technology permits the construction of a electrical interconnector having a connection density greater than that obtainable through printed circuit technology. Interconnectors manufactured according to printed circuit technology comprise a number of discrete layers, each layer comprising a dielectric material having a portion of its electrically conductive surface removed. The layers are stacked and laminated in a predetermined arrangement so that the remaining portions of the electrically conductive surface on each layer, forming signal traces, correspond in desired position to signal traces in adjacent layers. The electrical connections are formed by drilling holes, at predetermined locations, into an exposed surface of a final layer and through the laminated layers. The holes are filled with an electrically conductive material that electrically connects with the signal traces in each layer. Accordingly, the diameter of each connection, and more importantly the distance between connections within an interconnector, is defined by the diameter of a drill bit or the like. The diameter of a drill bit or the like is ultimately limited by the mechanical strength needed to withstand penetrating the laminated layers during the drilling. For example, using printed circuit technology the minimum distance obtainable between each connection may be approximately 0.1 millimeters.

Using thin film technology according to principles of this invention, the interconnector may be constructed by using the repetitive steps of depositing a thin film of dielectric material, selectively depositing a thin film of electrically conductive material forming signal planes, and depositing a thin-film of dielectric material onto the first dielectric layer and the signal planes. The electrical connections are formed by selectively etching predetermined locations of the last dielectric layer, corresponding to the desired pitch and number of electrical connections, and filling the etched portions with an electrically conductive material by using a metal deposition techniques such as vapor deposition and the like. Constructing an interconnector using such method permits the formation of connections having a smaller diameter than that obtainable by drilling according to printed circuit technology, since the hole formed by selective etching technique is not limited in diameter by concerns of mechanical strength. The ability to produce a smaller diameter connection facilitates positioning each connection closer together which creates a higher density interconnector. For example, using thin-film technology the minimum distance obtainable between each connection may be approximately ten micrometers.

The need to use space efficiently is an important consideration in the design and construction of high performance computers. The use of thin-film interconnectors in such an application is very desirable due to their small size and capacity for accommodating a large number of electrical connections (high density). However, using the dielectric material to encapsulate the conductive wires also makes the interconnector a rigid member, limiting its application to connecting electrical components that are oriented on the same plane. The need to use space efficiently often calls for placing interconnecting electrical components at different planes of elevation or orientation relative to each other. Accordingly, the thin-film interconnector should be capable of accommodating electrical interconnection with electrical components oriented in such a manner.

FIG. 1 shows a perspective view of two multi-chip modules 10 that are electrically connected to each other by a three dimensional thin-film electrical interconnector 12 constructed according to principles of the invention. The multi-chip modules (MCM) may each comprise a number of integrated circuits or the like that each require electrical connection with a printed circuit board or other MCM. For purposes of reference, the surface of the MCM located at the top portion of FIGS. 1 and 2 will be referred to as the front side and the surface of the thin-film interconnector adjacent to the MCM front side will be referred to as the front side throughout this description. The surface opposite the front side of the thin-film interconnector will be referred to as the back side throughout this description.

In a preferred embodiment, the thin-film interconnector 12 comprises two connectors 14 that are connected to each other by a plurality of electrically conductive wires 16 extending outwardly and away from adjacent faces of each connector. The wires are made from electrically conductive materials and facilitate the transfer of electrical signals and/or power between the connectors 14.

Figure 2:
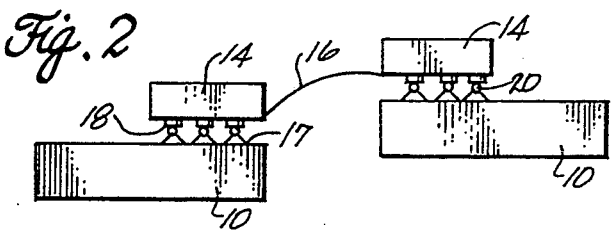
FIG. 2 is a side view of the thin-film electrical interconnector as used to electrically connect two multi-chip modules placed at different planes of elevation.

The front side of each MCM comprises a number of electrical contacts 17 as shown in FIG. 2 that each facilitate the transfer of electrical power and/or electrical signals to and from the integrated circuits contained within each MCM. The connectors 14 of the thin-film interconnector 12 each comprise a number of corresponding contact pads 18 at each front side surface. The MCMs are electrically interconnected to each other by connecting the electrical contacts 17 of each MCM with the corresponding interconnector contacts pads of each connector 14. The connection between the corresponding electrical contacts may be made by using a solder pad 20, that when melted flows to create an electrical connection between the electrical contacts of each MCM and the corresponding contact pads of each connector 14.

A preferred embodiment of the thin-film interconnector comprises two connectors 14 separated by a plurality of flexible wires 16, allowing it to accommodate interconnection between two MCMs or the like positioned at different heights or planes of orientation as shown in FIG. 2.

Turning now to the method of constructing the thin-film electrical interconnector, reference is made to FIGS. 3 through 7 which are cross sectional views of a preferred embodiment of the thin-film interconnector 12 during various stages of completion. These figures show an exaggerated cross sectional view of a preferred embodiment of the thin-film interconnector 12 for purposes of clearly illustrating the step wise method of constructing the thin-film interconnector according to practice of this invention. For purposes of reference, in FIGS. 3 through 7 the thin-film interconnector 12 is illustrated having a front side surface oriented near the top portion of each figure.

Figure 3:
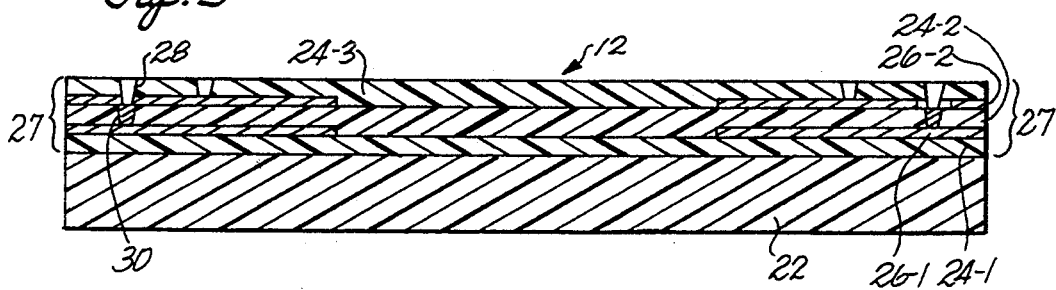
FIG. 3 is a cross sectional view of an in-process thin-film electrical interconnector after the application of a third dielectric layer.

Referring now to FIG. 3, a layer of dielectric material 24-1 is deposited onto the surface of a substrate 22. The substrate may be made from any type of metallic or non-metallic material. Preferred substrate materials may include silicon, aluminum and the like. The dielectric layer may be selected from the group of electrically nonconductive materials consisting of organic or inorganic polymers, ceramics, glass, glass-ceramics, polyimide-epoxy, epoxy-fiberglass, Teflon and the like. A preferred dielectric material may include polyimide commercially available from Dupont Chemical under the product name 2525 or 2611, benzocyclobutene or any other photo-etchable material.

The dielectric layer 24-1 may be added to the substrate 22 by one of several conventional methods well known to those skilled in the art. A first method is called the spin method due to the spinning process that is used to distribute the dielectric material over the top surface of the substrate. The spin method is carried out by placing the dielectric material, which is in a liquid state, near the center portion of the top surface of the substrate. The substrate is then rotated at a high rate to cause the dielectric material to spread across the top surface of the substrate to form a thin dielectric layer of uniform thickness. In this process, the excess dielectric material simply spins off the layer. The spin method is compatible with either organic or inorganic dielectric materials. After the dielectric material is dispersed, it is cured by exposure to radiation or elevated temperatures for an appropriate curing time for the material selected.

A second method for applying the dielectric layer 24-1 involves the direct spraying of the liquid dielectric onto the substrate. In the spray method the liquid dielectric material is forced through the tip of a spray gun nozzle by pressurized air to create a stream of droplets that are propelled towards and impinge the surface of the substrate, thereby forming a layer of dielectric material on the surface of the substrate. The spray method is typically used for the application of organic dielectrics. After the dielectric is applied it is cured by using well known methods similar to that described for the curing the dielectric layer applied by the spin method.

A third method for applying the dielectric layer is to use Corton coating. In this method, an organic material is extruded as a thin film across the top surface of the substrate. Either the extrusion nozzle or the substrate may be moved for the purpose of uniformly dispersing the dielectric material throughout the surface of the substrate. The Corton coating method is typically used to apply organic dielectric materials. After the dielectric material is applied it is cured by using well known methods similar to that used to cure the dielectric layer applied by the spin and spray method.

A signal plane 26-1 is created by applying a thin film of an electrically conductive material to selected portions of the surface of the dielectric layer 24-1. The material selected for making up the signal plane should have good electrical conductivity and may include pure metals, metal alloys, combinations of metals and dielectrics and the like. It is also desirable that the conductive material selected for the signal plane have thermal expansion characteristics or a coefficient of thermal expansion (CTE) that is approximately equal to that of the dielectric layer 24-1. Matching the CTE of electrical components that contact one another is desirable because it eliminates the development of thermal stresses which may occur during the operation of the interconnector, and thus eliminates a known cause of mechanical failure in electrical components.

The signal plane is selectively deposited onto the surface of the dielectric layer by using thin-film deposition techniques well known to those skilled in the art such as by sputter deposition, chemical vapor deposition, metal organic chemical vapor deposition, electroplating, electroless plating and the like. The thickness of the conductive layer deposited should be dependant on the particular impedance desired for the signal plane 26-1, in order to ensure excellent signal integrity. For example, if a signal plane having a relatively high impedance is desired, a small thickness of conductive material should be deposited onto the dielectric layer 24-1. If, however, a signal plane having a relatively low impedance is desired, a greater thickness of electrically conductive material should be deposited.

The signal plane is deposited at locations on the dielectric layer which correspond to the desired location of each connector 14. Conventional photolithographic techniques are used for depositing metal conductors in the desired locations or for depositing on the entire dielectric surface with selective removal. FIG. 3 illustrates a preferred embodiment of the thin-film interconnector comprising signal planes deposited at two different electrically isolated locations on the surface of the preceding dielectric layer, each location defining a connector 14. However, the thin-film interconnector may comprise signal planes deposited onto more than two different locations of the dielectric layer if desired, forming an equal number of connectors.

A second dielectric layer 24-2 is applied to the surface of the signal plane 26-1 and to a portion of the surface of the preceding dielectric layer by using deposition techniques similar to those described for depositing the previous dielectric layer 24-1 onto the surface of the substrate 22. The material chosen for the second dielectric layer should be the same as the materials previously described for depositing the dielectric layer 24-1 deposited onto the substrate 22.

A plurality of though holes 28 are formed through the thickness of the second dielectric layer at locations defined by the particular interconnection requirements of a connecting electrical component. Each through hole extends from the surface of the second dielectric layer 24-2, through the second dielectric layer, and to the surface of the signal plane 26-1. The through holes may be created by using methods well known to those skilled in the art such as by reactive ion etch, chemical etching and the like. A preferred method for forming the through holes is by using a photolithographic etching or photo etching process. The photo etching process is carried out by applying a uniform layer of a photoresist material to the surface of the second dielectric layer 24-2 and curing the photoresist material by well known methods. A photo mask having a plurality of circular openings is placed onto the surface of the photoresist material. The photo mask has a pattern corresponding to the desired quantity and location of the through holes to be formed in the second dielectric layer 24-2.

The position of each through hole with respect to the signal plane is determined by the electrical connection requirements of a particular electrical component. This temporary subassembly is exposed to light, causing the photoresist material to develop in those areas not covered by the photo mask which serves to define the locations for the desired through holes 28. The developed areas are etched in a conventional manner. A chemical etching compound is applied to the developed areas of the photoresist to etch through the second dielectric layer to the surface of the signal plane 26-1.

The through holes that are formed according to this method are inherently in the shape of a truncated cone having a first diameter near the surface of the second dielectric layer 24-2 and a second diameter, which is smaller than the first diameter, near the surface of the signal plane 26-1. The conical configuration of the through holes are caused both by the progressive decrease in etching efficiency as the etching compound travels from the surface of the dielectric layer through its thickness and the slight undercutting of the photoresist as each hole is etched deeper.

The through holes 28 are filled with an electrically conductive material to form vias 30 by a process referred to as metalization. The conductive material selected for the metalization of the through holes may include pure metals, metal alloys, combinations of metals and dielectrics and the like. However, in selecting the metalizing material it is desirable that the conductive material selected have a coefficient of thermal expansion approximately equal to that of the material used to make up the signal plane 26-1.

Several techniques known to those skilled in the art may be used to fill or metalize the through holes 28. However, according to practice of this invention the technique chosen should accomplish void free hermetic metalization of the through holes. A preferred technique capable of providing void free metalization of the through holes is by the well known process of electroplating. In the electroplating process, the metal or alloy chosen to metalize or fill the hole typically serves as the anode which is immersed in an electrolytic bath containing ions of the metalizing material. The signal plane 26-1 is the cathode in the plating process and is immersed into the electrolytic bath. An electrical voltage is applied between the metalizing material (anode) and the signal plane (cathode) which causes the metalizing material to be deposited down into the through holes and onto the surface of the signal plane. The metalization is complete once the through holes are filled to the surface of the second dielectric layer 24-2.

Electroplating ensures void free hermetic filling of the through holes because the metalizing material plates only to the cathodic portion of the hole which is initially the signal plane and thereafter the surface of the deposited metal. The metalizing material will not be deposited or plated on the wall of the hole since each hole wall is made up of the nonconductive dielectric material. The ability to metalize the holes from the bottom up, without depositing the metalizing material about the hole wall, eliminates the occurrence of voids during metalization, and thus maximizes the electrical conductivity of the resulting via. Other techniques used for metalization often result in the formation of voids due to the metalizing material depositing on the hole diameter, making it difficult or impossible for the metalizing metal to pass beyond the constriction to fill the bottommost portion of the hole.

Another preferred technique used to provide a void free hermetic metalization of the through holes 28 is metal organic chemical vapor deposition (MOCVD). In the MOCVD process, the materials chosen to fill the through holes (a metal organic composition) is placed in an evaporation chamber and heated to its sublimation temperature in an oxygen free atmosphere to form a vapor. The vapor is directed into a reaction chamber where it is passed over the through-hole interconnector which has been heated. The vapors lay down to form a metal film on the surface of the signal plane 26-1 which serves as a nucleation site for the metallic vapor. The metal vapor undergoes thermal decomposition on the surface of the signal plane, leaving a film of conductive metal which gradually builds up the hole. The metalization is complete once the through holes are filled to the surface of the second dielectric layer.

MOCVD is a preferred technique for metalizing the through holes because it permits the deposition of conductive materials comprising metal and non-metal compounds. Although the organic components are not good conductors, their inherently low CTE helps to offset an inherently high CTE of a conductive metal component, making their use particularly desirable in matching the CTE to the surrounding dielectric layer 24-2.

An electroless plating technique may also be used to provide a void free hermetic metalization of the through holes.

A second signal plane 26-2 is created by selectively depositing a layer of electrically conductive material onto the surface of the second dielectric layer 24-2. The conductive material selected may be similar to the materials previously described for forming the first signal plane 26-1. The second signal plane is deposited onto the surface of the second dielectric layer at locations corresponding to the preceding signal plane. The conductive material may be deposited by using the same deposition techniques described for forming the first signal plane 26-1. The conductive material should be deposited onto the surface of the second dielectric layer in a manner avoiding contact with the vias extending from the first signal plane to the surface of the second dielectric layer. Contact between the second signal plane and the vias is to be avoided to prevent an electrical short circuit between the first signal plane and second signal plane. A method of avoiding such contact in a preferred embodiment may be by selectively depositing the conductive material forming the second signal plane onto a portion of the surface of the second dielectric layer between the vias of the preceding first signal plane. However, because the electrical connection requirements of each particular electrical component may vary, it is to be understood that in order to avoid a short circuit between signal planes the signal planes may be deposited in a manner other than that specifically described.

A third dielectric layer 24-3 is deposited onto the surface of the second signal plane 26-2 and portions of the preceding dielectric layer. The third dielectric layer may comprise the same materials and may be deposited by using the same deposition techniques as previously described for the first and second dielectric layers.

A plurality of through holes 28 are formed in the third dielectric layer 24-3 by using the same techniques as described for forming the through holes in the second dielectric layer. The location and number of through holes formed in the third dielectric layer should correspond to that both of the previously formed vias 30 residing in the second dielectric layer and the vias desired for the immediately preceding signal plane 26-2. Again the location and number of the through holes are determined by the electrical connection requirements of a particular electrical component. FIG. 3 shows that in a preferred embodiment, the through holes 28 formed in the third dielectric layer 24-3 correspond in number and location to the previously formed vias 30, connected to signal plane 26-1, and new vias that are to connect with signal plane 26-2.

The through holes 28 in the third dielectric layer are metalized to form vias 30. The through holes may be metalized by using the same electrically conductive materials and metalization techniques as previously described for metalizing the through holes in the second dielectric layer 24-2.

The steps of forming a signal plane, depositing a dielectric layer onto the surface of the signal plane, forming through holes in the dielectric layer, and metalizing the through holes to form electrically conductive vias may be repeated in the manner described as many times as desired in order to obtain a predetermined number and arrangement of signal planes and vias.

The formation of the through holes and the metalization of the through holes to form electrically conductive vias using thin-film technology is advantageous because it allows for the formation of vias having a high aspect ratio, i.e., the ratio of the length or depth of the via to the diameter of the via. By using thin-film technology, and the methods previously described for through hole formation and metalization, an interconnector can be constructed having a much greater density of vias than that constructed using printed circuit technology. Therefore, thin-film technology is to be preferred for constructing interconnectors used in high performance computers. Thin-film technology permits the construction of an interconnector with vias having a pitch of approximately ten micrometers. Using printed circuit technology, on the other hand, may effectively limit the pitch of vias to approximately 0.10 millimeters.

During the fabrication of the thin-film interconnector it may be desirable to form a ground plane at the surface of one of the dielectric layers in place of a signal plane. A ground plane is generally desirable to help minimize static or interference caused when electrical lines or electrically conductive signal planes in close proximity to each other are used to transfer signals or power. In such instances a ground plane may be inserted between the electrical lines to act as a shield to protect each electrical line from undesirable electromagnetic effects. The use of such ground planes may be particularly desirable in applications such as high performance computers where a high degree of signal integrity is desired.

Figure 4:
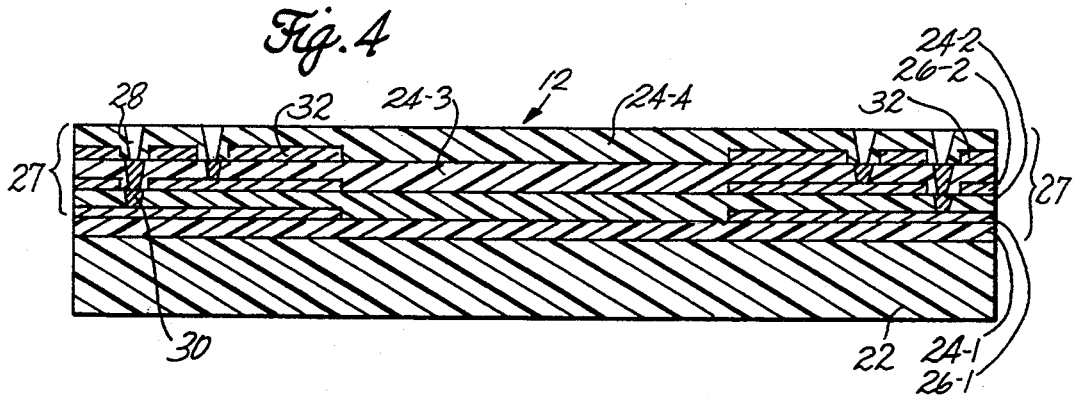
FIG. 4 is a cross sectional view of the in process thin-film electrical interconnector after the application of a fourth dielectric layer.

In FIG. 4 a ground plane 32 is applied to the surface of the third dielectric layer 24-3. The ground plane may be made from the same electrically conductive materials previously described for forming the signal planes and vias in order to match the CTE with the electrically conductive thin-film interconnector components. The ground plane may be applied by using the same deposition techniques described for depositing the signal planes 26-1 and 26-2. The ground plane is deposited onto the surface of the dielectric surface at locations corresponding to preceding signal planes. The ground plane should be selectively deposited so that it avoids contact with the vias residing in the immediately preceding dielectric layer as shown in FIG. 4.

The ground plane in FIG. 4 was deposited onto the surface of the third dielectric layer 24-3 for purposes of illustration only. It should be understood that the placement of one or more ground planes 32 within the thin-film interconnector is a function of the particular electrical signal planes that the designer wishes to electrically shield and protect from unwanted electromagnetic effects. Ultimately, the location and number of ground planes within the thin-film interconnector will be dependent on the electrical connection requirements of the particular electrical component which the interconnector will connect with.

Figure 5:
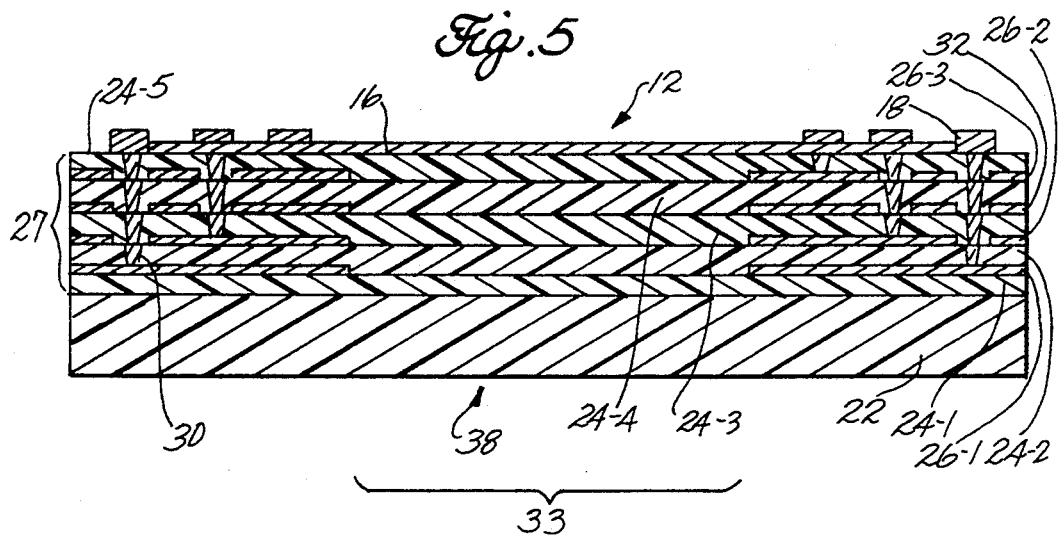
FIG. 5 is a cross sectional view of the in-process thin-film electrical interconnector after the application of a fifth dielectric layer, contact pads, and wires.

FIG. 5 shows the in-process thin-film interconnector after a fourth dielectric layer 24-4 has been deposited onto the surface of the ground plane 32 and portions of the preceding dielectric layer. The fourth dielectric layer may comprise the same materials and may be deposited by using the same deposition techniques as those described for the previous dielectric layers. A plurality of through holes are formed in the fourth dielectric layer by using the same techniques as described for forming the through holes in preceding dielectric layers. The through holes 28 are formed at locations corresponding to the vias extending from both the first signal plane 26-1 and the second signal plane 26-2. The through holes are metalized by using the same deposition technique described for metalizing the through holes formed in the previous dielectric layers.

A third signal plane 26-3 is deposited onto the surface of the fourth dielectric layer at the same location as the previous signal planes. The third signal plane may comprise the same materials and may be deposited at the same location as the preceding signal planes by using the same deposition techniques as those described for forming previous signal planes 26-1 and 26-2.

A fifth dielectric layer 24-5 is deposited onto the surface of the third signal plane 26-3 and portions of the previous dielectric layer. The fifth dielectric layer may comprise the same material and be deposited by using the same deposition techniques as described for depositing the previous dielectric layers 24-1, 24-2, 24-3, and 24-4. A plurality of through holes are formed in the fifth dielectric layer 24-5 by using the same technique as that used to form through holes in the previous dielectric layers. The through holes are formed at locations corresponding to the vias extending from signal planes 26-1 and 26-2 as well as the number of vias desired to extend from signal plane 26-3. The through holes are metalized to form vias by using the same materials and deposition techniques as described for metalizing the through holes in previous dielectric layers. For purposes of clarity and illustration, the fifth dielectric layer in FIG. 5 is represented as being a final dielectric layer.

After the desired number of signal planes, ground planes, dielectric layers and vias have been formed, a number of contact pads 18 are selectively deposited onto the front side surface of the final dielectric layer. The contact pads are deposited at locations corresponding to and electrically connecting with the vias 30 of each connector 14. The contact pads may comprise the same type of material as that described for metalizing the through holes in order to match the CTE of the corresponding vias and prevent the occurrence of thermal stress. The contact pads may be deposited by using the same types of well known selective deposition techniques previously described for forming the signal planes.

Although FIG. 5 illustrates an embodiment of the thin-film interconnector connector 12 comprising three signal planes, a ground plane, and five dielectric layers, it should be remembered that this particular embodiment was described for purposes of clarity and illustration. Accordingly, it is to be understood within the scope of present invention that the thin-film interconnector 12 may be configured having a different number and/or arrangement of signal planes, ground planes, dielectric layers, vias, and contact pads than that specifically described and illustrated in order to accommodate the particular electrical connection requirements of an electrical component.

By depositing multiple thin film signal planes, the electrical conductors can cross each other as desired for complex interconnections. Thus, a lead on one MCM can readily be connected with any desired lead on an adjacent MCM. The number of signal planes formed depends on the desired complexity of the interconnections and extent of crossing of conductors for a given application.

The method of depositing the sequence of signal planes and dielectric layers at predetermined locations within the thin-film interconnector results in the formation of an intermediate body 33 comprising the substrate and dielectric layers. The intermediate body resides between and electrically separates each laterally spaced signal plane set 27. FIG. 5 shows a preferred embodiment of the thin-film interconnector having a single intermediate body occupying a center portion of the interconnector between each signal plane set 27. However, it is to be understood that the number of intermediate bodies within the thin-film interconnector may be more than one depending on the desired number of signal plane sets and corresponding connectors. For example, a thin-film interconnector comprising three signal plane sets, and thus three connectors, will comprise two intermediate bodies.

Figure 6:
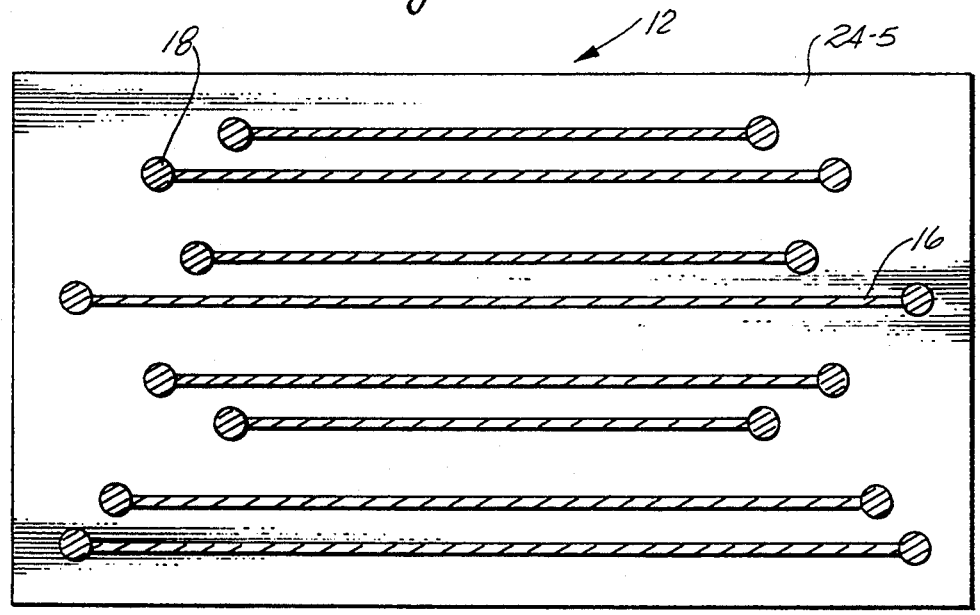
FIG. 6 is a plan view of the in process thin-film interconnector after application of contact pads and wires.

A number of electrically conductive wires 16 are formed on the surface of the final dielectric layer as shown in FIGS. 5 and 6. The wires electrically connect with and extend from the contact pads of one connector, across the intermediate body 33, and electrically connect with corresponding contact pads at the other connector. The wires may be made from the same types of electrically conductive materials described for depositing the signal planes, ground plane, vias, and the contact pads in order to ensure a matching CTE. The wires may be deposited onto the front side surface of the connectors and intermediate body by using the same type of selective deposition technique described for depositing the signal planes and ground planes. FIG. 6 shows a plan view of the in-process thin-film interconnector after the wires have been deposited.

Figure 7:
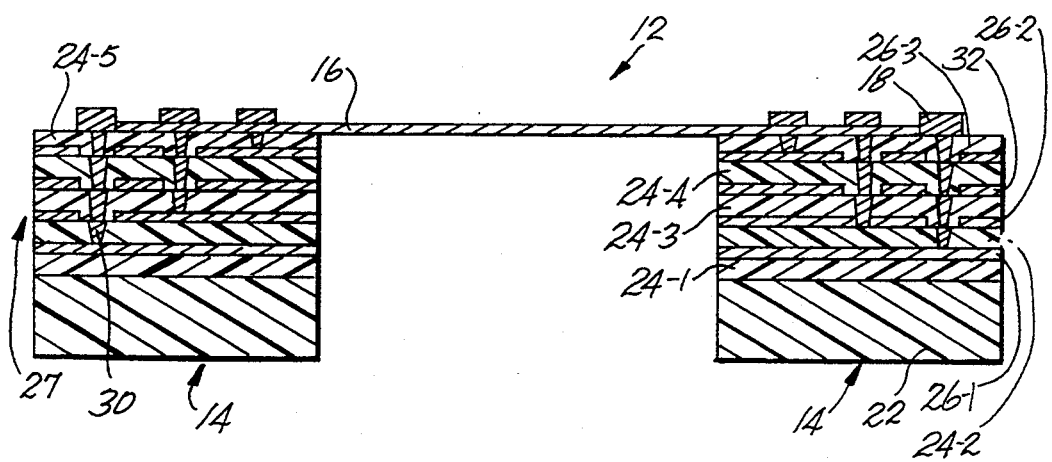
FIG. 7 is a cross sectional view of the completed thin-film electrical interconnector after an intermediate body has been removed.

FIG. 7 shows the completed thin-film interconnector after the intermediate body has been removed, forming the connectors 14 that are electrically and mechanically connected to each other by the plurality of wires 16. The intermediate body may be removed by using the same techniques previously described for forming the through holes in each of the dielectric layers. The removal of the intermediate body facilitates the flexible movement of each connector with respect to each other connector, allowing the thin-film interconnector to connect with electrical components located at different planes or orientation.

Alternatively, if a rigid thin-film interconnector is desired the intermediate body may remain in place, and thus the interconnector may be used to connect electrical components positioned on the same plane of orientation.

The "wires" 16 between adjacent connections are deposited with sufficient thickness to be self supporting when the intermediate body is removed. The material used for the wires also has appreciable ductility for accommodating the bending required for the connectors to make connection with MCMs at different elevations or orientations. The wires are separated from each other and do not need additional electrical insulation, however, if desired the contact pads on the connectors can be temporarily masked and insulation deposited on the wires.

In effect, the process produces two (or more) electrical connectors with a wire cable interconnecting them. In an ordinary ribbon cable, pin 1 of one connector is connected to pin 1 of the other connector, etc. With the thin film connectors, any "pin" or connection pad may be connected to any other desired pad on the other connector. Furthermore, the patterns on the signal planes may be used for connecting one pad or one connector to multiple pads on the other connector.

Figure 8:
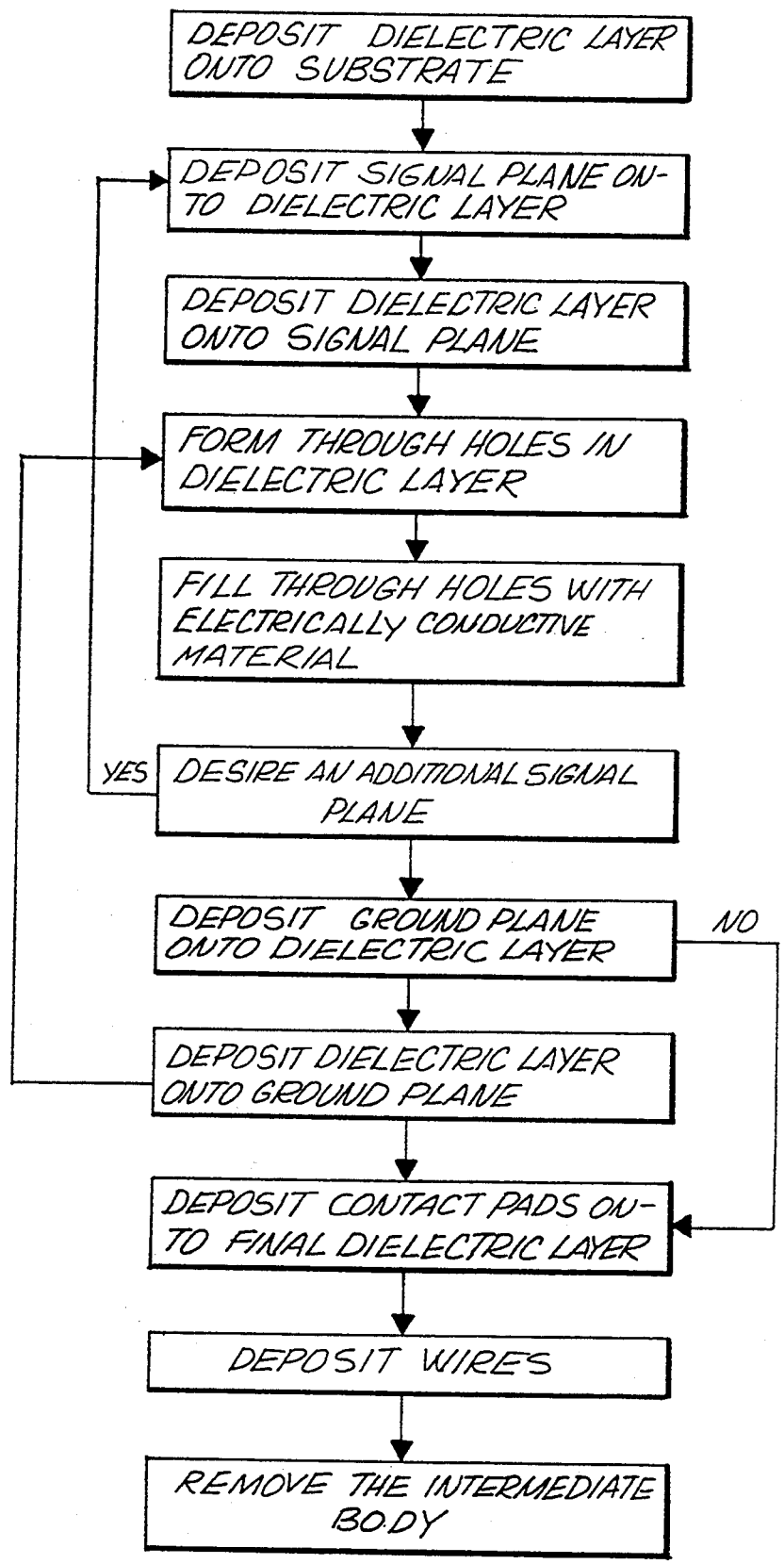
FIG. 8 is a flow chart summarizing the step wise method of fabricating the thin-film interconnector according to practice of the invention.

FIG. 8 is a flow chart summarizing the step wise method of fabricating the thin-film interconnector according to principles of this invention as specifically described and illustrated.

FIGS. 9 through 11 show an embodiment of the thin-film interconnector having two connectors 14 with each connector oriented at different positions relative to each other. FIG. 9 shows how the thin-film interconnector may be used to facilitate electrical connection between electrical components positioned adjacent to each other on the same plane and orientation. FIG. 10 shows how the thin-film interconnector may be used to facilitate electrical connection between electrical components positioned adjacent to each other on planes of orientation perpendicular to each other. FIG. 11 shows how the thin-film interconnector may be used to facilitate electrical connection between electrical components positioned adjacent to each other on planes of orientation stacked and parallel to each other. It is to be understood the these examples are not meant to be exhaustive and that a wide variety of other connection orientations may be achieved due to the flexible interaction between connectors.

FIG. 12 shows an embodiment of the thin-film interconnector having an approximately complementary ridge 34 and groove 35 integral with the back side surface of each connector 14. The ridge and groove may be used to align the back side surface of each connector if it is desired that the thin-film interconnector act as a rigid member. If desired, the connectors 14 may be secured together by applying an adhesive to the ridge and groove portions of each connector, aligning the ridge and groove portions, and then pressing the back side surfaces of each connector together. Organic or inorganic adhesives that are capable of withstanding the soldering temperatures encountered when the thin-film interconnector is connected to the electrical components may be used to secure the connectors. Suitable organic adhesives may include epoxy, thermoplastic polyimide, polyethersulfone, and polyether ketone, which are all available in film form. Suitable inorganic adhesives may include low sealing temperature (below 450° C.) glasses and metallic alloys. If necessary, glass spacers or the like may be used between the back side surfaces of the connectors to adjust the total thickness necessary to achieve a particular electrical interconnection.

Although FIG. 12 illustrates a ridge and groove type arrangement, other configurations may be used within the scope of invention to facilitate the cooperation and alignment of the back side surfaces of each connector. Additionally, although FIG. 12 shows a thin-film interconnector capable of the cooperating interaction between connectors of a common thin-film interconnector, it is to be understood within the scope of invention that such cooperating interaction may also be achieved between connectors 14 of different thin-film interconnectors.

Although a preferred embodiment of the thin-film interconnector has been specifically described and illustrated above, it is to be understood that variations or embodiments of the thin-film interconnector apparent to those skilled in the art are within the scope of this invention. For example, FIG. 13 shows an alternate embodiment of the thin-film interconnector comprising three connectors 14 manufactured according to practice of this invention. This embodiment may be obtained by selectively depositing the signal planes at three different locations on preceding dielectric layers, forming three signal plane sets. Such embodiment may be particularly desirable to connect three electrical components each having a different plane of orientation. Accordingly, it is to be understood within the scope of this invention that the thin-film interconnector may comprise any number of connectors depending on the predetermined electrical interconnection requirements.

FIG. 14, for example, shows an alternative embodiment of the thin-film interconnector fabricated according to methods of the present invention comprising five connectors 14. This embodiment may be particularly desirable to facilitate electrical connection between electrical components positioned at five different planes of orientation. This embodiment may be obtained by selectively depositing each signal plane at five different locations on preceding dielectric layers, forming five signal plane sets.

Since many such variations may be made, it is to be understood that within the scope of the following claims, this invention may be practiced otherwise than specifically described.

What is claimed is:

1. A method for fabricating a thin-film interconnector comprising:
    forming an electrically conductive layer onto selected surface portions of an underlying electrically nonconductive layer;
    forming a dielectric layer on the surface of the conductive layer;
    forming electrically conductive vias extending through the dielectric layer and to the conductive layer;
    repeating the sequence of forming conductive layers, dielectric layers, and conductive vias until a predetermined number of conductive layers is obtained, wherein the conductive layers are each deposited onto selected surface portions of an underlying dielectric layer to form a number of discrete conductive layer sets;
    electrically connecting the conductive vias within each conductive layer set by flexible electrically conductive wires connected to the conductive vias near a surface portion of a final dielectric layer;
    removing the nonconductive layer and dielectric layers that are positioned between conductive layer sets to form at least two independent electrical connectors that are flexibly connected to one another by only the flexibly electrically conductive wires.

2. A method as recited in claim 1 comprising electrically connecting the conductive vias of each conductive layer set by selectively depositing an electrically conductive material onto the surface of a dielectric layer comprising conductive vias.

3. A method as recited in claim 1 comprising forming the conductive vias by forming holes in each dielectric layer and filling the holes with an electrically conductive material.

4. A method as recited in claim 3 comprising forming a plurality of holes in each dielectric layer, the holes extending from the surface of a dielectric layer to the conductive vias in a preceding dielectric layer.

5. A method as recited in claim 4 comprising forming a plurality of holes in predetermined number of dielectric layers, the holes extending from the surface of the dielectric layers to a preceding conductive layer.

6. A method as recited in claim 5 comprising filling the plurality of holes with an electrically conductive material to form vias.

7. A method as recited in claim 1 comprising forming contact pads on the surface of a final dielectric layer by depositing an electrically conductive material onto each conductive via.

8. The method as recited in claim 7 comprising forming the conductive layers, forming the conductive vias, forming the contact pads and electrically connecting the conductive vias by using electrically conductive materials having approximately equal coefficients of thermal expansion.

9. The method as recited in claim 1 comprising forming features on a back side surface of a first nonconductive layer that are approximately complementary to each other.

10. A method as recited in claim 7 comprising electrically connecting together the contact pads of each connector by the wires.

11. A method for fabricating a three dimensional thin-film interconnector capable of facilitating electrical interconnection with electrical components positioned at different planes of orientation, the method comprising:
    forming a first dielectric layer on the surface of a substrate;
    forming a conductive layer on selected portions of the surface of the first dielectric layer;
    forming a second dielectric layer on the surface of the conductive layer and on portions of the first dielectric layer surface that are not deposited with the conductive layer;

forming a plurality of holes in the second dielectric layer;

filling the plurality of holes with an electrically conductive material;

repeating the sequence of forming a conductive layer, forming a subsequent dielectric layer, forming a plurality of holes in the subsequent dielectric layer, and filling the plurality of holes until a predetermined number of conductive layers are achieved;

forming a plurality of contact pads on the surface of a final dielectric layer;

forming a plurality of wires extending between the contact pads to electrically connect the contact pads together;

removing a portion of the substrate and dielectric layers existing between the contact pads to form at least two connectors that are flexibly connected with one another only by the wires, wherein each connector is capable of electrically connecting with an electrical component.

12. The method as recited in claim 11 comprising forming the conductive layers by selectively depositing an electrically conductive material onto the surface of a preceding dielectric layer at different locations electrically isolated from each other, the conductive layers being deposited at the same location forming a conductive layer set.

13. The method as recited in claim 12 comprising depositing each conductive layer in a manner that avoids contact with the filled holes of a preceding dielectric layer.

14. The method as recited in claim 12 comprising forming the holes by removing a portion of each dielectric layer residing between the surface of the dielectric layer and the surface of a preceding conductive layer, the location of the hole corresponding to a predetermined electrical connection.

15. The method as recited in claim 14 comprising forming holes by removing a portion of each dielectric layer residing between the surface of the dielectric layer and the surface of a preceding dielectric layer, the location of the holes corresponding to the location of filled holes in the preceding dielectric layer.

16. The method as recited in claim 11 comprising forming the contact pads by selectively depositing a conductive material onto the surface of a final dielectric layer at locations corresponding to the filled holes.

17. The method as recited in claim 12 comprising forming the wires by selectively depositing an electrically conductive material onto the surface of a dielectric layer comprising the filled holes.

18. The method as recited in claim 17 comprising depositing each wire so that it electrically connects a filled hole in one conductive layer set with a corresponding filled hole in another conductive layer set.

19. The method as recited in claim 12 comprising removing a portion of the substrate and dielectric layers that does not comprise a conductive layer set, forming at least two connectors held together by the plurality of wires.

20. The method as recited in claim 19 comprising forming approximately complementary features on the surface of each connector opposite the contact pads, the complementary features being formed to facilitate the alignment of the connectors with each other.

21. The method as recited in claim 20 comprising attaching each connector to another connector by applying an organic or inorganic adhesive to the complementary features, aligning the complementary features of each connector, and pressing the connectors together.

22. The method as recited in claim 12 comprising forming conductive layers, filling the plurality of holes, forming contact pads, and forming a plurality of wires by using electrically conductive materials having approximately equal coefficients of thermal expansion.

23. A method for forming a thin-film interconnector for transferring electrical signals between nonplanar electrical components, the method comprising:

applying a first dielectric layer to the surface of a substrate;

applying a first signal plane to selected portions of the surface of the first dielectric layer;

applying a second dielectric layer to the surface of the first signal plane and substrate;

forming a first plurality of holes in the second dielectric layer in a pattern corresponding to a desired electrical connection;

filling the first plurality of holes with an electrically conductive material;

applying a second signal plane to selected portions of the surface of the second dielectric layer;

applying a third dielectric layer to the surface of the second signal plane and second dielectric layer;

forming a second plurality of holes in the third dielectric layer in a pattern corresponding to both the first plurality of filled holes and to a desired electrical connection;

filling the second plurality of holes with an electrically conductive material;

applying a plurality of contact pads to the surface of the third dielectric layer at locations corresponding to the positions of the first and second plurality of filled holes;

applying a plurality of wires to the surface of the third dielectric layer to electrically connect the plurality of contact pads together; and removing a portion of the substrate and dielectric layers that neither comprises the signal planes nor the plurality of filled holes.

24. The method as recited in claim 23 comprising repeating the steps of applying a signal plane to the surface of a dielectric layer, applying a dielectric layer to the surface of the signal plane, forming a plurality of holes in the dielectric layer, and filling the plurality of holes with an electrically conductive material until a predetermined number of signal planes is achieved.

25. The method as recited in claim 24 comprising forming the plurality of holes by removing portions of each dielectric layer extending between the surface of the dielectric layer and the preceding signal plane, the holes being formed at locations corresponding to predetermined electrical connections.

26. The method as recited in claim 25 comprising forming the plurality of holes at locations corresponding to filled holes in the preceding dielectric layer.

27. The method as recited in claim 26 comprising applying the signal planes by selectively depositing an electrically conductive material onto the surface of each preceding dielectric layer at two or more different locations electrically isolated from each other, the sequence of signal planes deposited at the same location on the dielectric layers forming a signal plane set, the signal planes within each set being deposited in a manner that avoids contact with the plurality of filled holes in the preceding dielectric layer.

28. The method as recited in claim 27 comprising applying the plurality of wires by selectively depositing an electrically conductive material onto the surface of a final dielectric layer, each wire extending between and electrically connecting with a contact pad of one signal plane set and a corresponding contact pad of another signal plane set.

29. The method as recited in claim 28 comprising removing portions of the substrate and dielectric layers that do not comprise a signal plane set, forming at least two electrical connectors attached to one another by the plurality of wires.

30. The method as recited in claim 29 comprising applying a ground plane to the surface of the dielectric layer in place of a signal plane, the substitution of the ground plane being dependent on the electrical characteristics of the surrounding signal planes, after applying the ground plane a dielectric layer is applied to the surface of the ground plane and a plurality of holes are formed in the dielectric layer, the holes having a pattern corresponding to the plurality of filled holes in the proceeding dielectric layer.

31. The method as recited in claim 30 comprising applying the signal planes, ground planes, filling the holes, applying the contact pads, and applying the wires by using electrically conductive materials having approximately equal coefficients of thermal expansion.

32. The method as recited in claim 31 comprising forming approximately complementary features on the surface of each connector opposite the contact pads, the complementary features being formed to facilitate the alignment of the connectors with each other.

33. The method as recited in claim 32 comprising attaching each connector to another connector by applying an organic or inorganic adhesive to the complementary features, aligning the complementary features of each connector, and pressing the connectors together.

* * * * *